(12) United States Patent
Li et al.

(10) Patent No.: US 10,409,357 B1
(45) Date of Patent: Sep. 10, 2019

(54) COMMAND-ORIENTED LOW POWER CONTROL METHOD OF HIGH-BANDWIDTH-MEMORY SYSTEM

(71) Applicant: Cadence Design Systems, Inc., San Jose, CA (US)

(72) Inventors: Xiaofei Li, Beijing (CN); Zhehong Qian, Shanghai (CN); Yanjuan Zhan, Beijing (CN); Ying Li, Shanghai (CN); Buying Du, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 250 days.

(21) Appl. No.: 15/282,979

(22) Filed: Sep. 30, 2016

(51) Int. Cl.
*G06F 1/3287* (2019.01)
*G11C 7/10* (2006.01)
*G11C 11/406* (2006.01)
*G06F 1/3234* (2019.01)
*G06F 1/3203* (2019.01)
*G06F 1/3225* (2019.01)
*G06F 1/3228* (2019.01)

(52) U.S. Cl.
CPC .......... *G06F 1/3287* (2013.01); *G06F 1/3275* (2013.01); *G11C 7/1048* (2013.01); *G11C 7/1072* (2013.01); *G11C 11/40618* (2013.01); *G06F 1/3203* (2013.01); *G06F 1/3225* (2013.01); *G06F 1/3228* (2013.01)

(58) Field of Classification Search
CPC .... G06F 1/3287; G06F 1/3203; G06F 1/3275; G06F 1/3228; G06F 1/3225; G11C 7/1048; G11C 7/1072; G11C 11/40618

USPC .......... 713/323, 320, 324; 711/106
See application file for complete search history.

(56) References Cited

U.S. PATENT DOCUMENTS

| | | | |
|---|---|---|---|
| 9,432,298 B1* | 8/2016 | Smith | H04L 49/9057 |
| 2007/0091696 A1* | 4/2007 | Niggemeier | G06F 13/18 365/198 |
| 2011/0264934 A1* | 10/2011 | Branover | G06F 1/3203 713/320 |
| 2011/0296214 A1* | 12/2011 | Arntzen | G06F 1/3203 713/320 |
| 2012/0066445 A1* | 3/2012 | Searles | G06F 1/3275 711/106 |
| 2015/0026493 A1* | 1/2015 | Kim | G06F 1/3275 713/320 |
| 2016/0070582 A1* | 3/2016 | Clovis | G06F 1/3296 710/104 |
| 2016/0364345 A1* | 12/2016 | Jeter | G06F 13/161 |
| 2017/0316818 A1* | 11/2017 | Saifuddin | G11C 11/40615 |
| 2017/0365305 A1* | 12/2017 | Chang | G11C 5/04 |

* cited by examiner

*Primary Examiner* — Ji H Bae
(74) *Attorney, Agent, or Firm* — Vista IP Law Group, LLP

(57) ABSTRACT

Embodiments of the invention provide a command-oriented method to lower power consumption of PHY during idle time periods. The idle time periods occur because HBM Commands have certain timing windows where there is no data transmission on DFI data signals between the memory controller and the PHY data slice. These windows may be utilized to power down the PHY data slice data path through DFI signal handshaking. In contrast to the conventional low power mode, this method provides an advanced low power mode that can further reduce power consumption in different modes at each suitable idle time based on different command types.

20 Claims, 15 Drawing Sheets

COMMAND-ORIENTED LOW POWER CONTROL METHOD OF HIGH-BANDWIDTH-MEMORY SYSTEM

FIELD

This disclosure relates to the field of high-bandwidth memory systems.

BACKGROUND

Memory systems have significantly evolved due to advancements in fabrication technology. High-Bandwidth-Memory (HBM) is an example of an emerging memory standard defined by the JEDEC organization. HBM is a high-performance dynamic random access memory (DRAM) that uses a wide-interface architecture and stacked configurations to achieve high-speed and low-power operation. The HBM subsystems involve different types of memory controllers (e.g., full-speed or half-speed), HBM mixed-signal physical interface (PHY) and HBM DRAM. The HBM subsystem is especially suitable for applications involving high performance graphics and computing, high-end networking and communication devices, and memory-hungry processors.

In general, the HBM operates in either normal operation or low power mode. During normal operation mode, the PHY control slice and PHY data slice are both used to transfer control commands and data between the Memory Controller and HBM DRAM devices. During the conventional low power mode, the Memory Controller allows the PHY to enter into a low power mode through the Low Power Control Interface only when the DRAM devices have entered into a Power Down (PD) or Self-Refresh (SREF) state. In the PD and SREF mode of HBM DRAM device, the Memory Controller may direct the PHY to shut down its control slice and data slice because there are no commands and no data transmissions between Memory Controller and PHY.

In a HBM subsystem, it is advantageous to conserve power consumption by placing the PHY in a low power state when idle. The PHY is considered idle when the control interface is not sending any commands and all read and write data has transferred on the PHY, reached its destination, and the write data transfer has completed on the DRAM bus. For example, the PHY may enter a lower power state when the Memory Controller is aware that the memory devices will remain in an idle state for a period of time. Frequently used HBM commands (e.g., PREA, REF, etc.) contain timing windows when no data transmission occurs on DFI data signals between Memory Controller and PHY data slice. As such, these windows may be utilized to power down the data path through a low power control handshake. Depending on the state of the subsystem, the Memory Controller will communicate this information to the PHY allowing the PHY to enter the appropriate power saving state.

One mechanism for addressing wasteful power consumption is to set idle memory in a low power mode. However, it can be difficult to know when to transition in and out of low power mode because there are latencies associated with entering into and exiting from the various operation modes. A policy that toggles modes too frequently may increase the latency of memory commands which thereby reduces performance. Additionally, a policy that transitions to low power mode too slowly will miss opportunities to save power, while a policy that transitions out of low power mode too slowly will unnecessarily degrade performance.

Therefore, there is a need for an improved approach to using a command-oriented method to shutting down the data slice during an idle period based on different command types.

SUMMARY

Embodiments of the present invention provide an approach for using a command-oriented method to lower the power consumption of PHY data slice through a lower power control handshake. Frequently used HBM commands (e.g., Precharge All, Refresh, etc.) contain timing windows when no data transmission occurs on DFI data signals between Memory Controller and PHY data slice. These windows may be utilized to power down the data path through DFI signal handshaking. In contrast to prior techniques, the conventional operation mode oriented low power control handshake occurs only when DRAM enters into SREF or PD mode, while this command-oriented method introduces different low power control handshakes based on commands in normal operation mode. The present disclosures provide an advanced method of power management for HBM Memory Controller and PHY subsystems to acquire deeper power saving results based on different command types.

According to some embodiments, disclosed is an approach for taking advantage of HBM commands to utilize timing windows where on data transmission occurs to power down the data path. According to some embodiments, disclosed is an approach for using a low power control handshake to lower power consumption.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The drawings illustrate the design and utility of embodiments of the present invention, in which similar elements are referred to by common reference numerals. In order to appreciate the advantages and objects of embodiments of the invention, reference should be made to the accompanying drawings. However, the drawings depict only certain embodiments of the invention, and should not be taken as limiting the scope of the invention.

DETAILED DESCRIPTION

Figure 1:
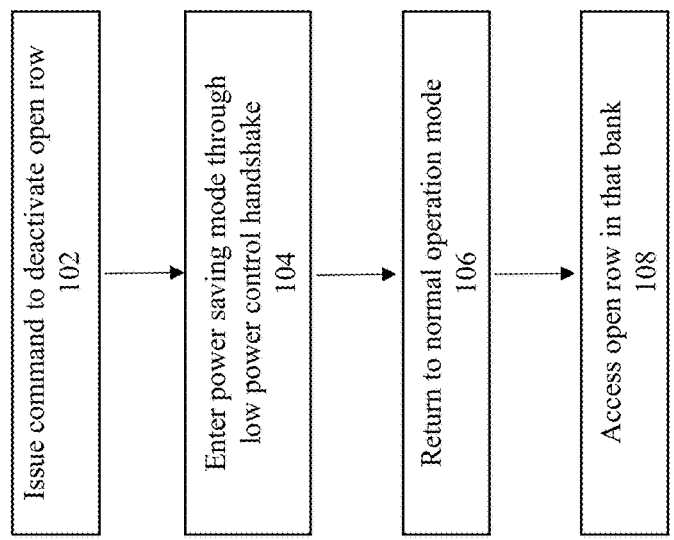
FIG. 1 illustrates a process flow for using a command-oriented method to lower power consumption through a low power control signal handshake according to some embodiments of the invention.

Various embodiments will now be described in detail with reference to the drawings, which are provided as illustrative examples of the invention so as to enable those skilled in the art to practice the invention. Notably, the figures and the examples are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

In the HBM subsystem, a low power control handshake between Memory Controller and PHY may be used to place the memory subsystem into a lower power state. The PHY may be able to enter a Memory Controller-initiated low power state if the Memory Controller has knowledge that the PHY will be idle for a period of time. During low power handshaking, the DFI clock should maintain a valid and constant clock operating frequency until certain DFI signals have reached a constant state.

In general, HBM Memory Controller-PHY subsystems may use an operation oriented low power method to conserve power consumption. In legacy systems, HBM may operate in either a normal operation mode or low power mode. In normal operation mode, the PHY control slice and PHY data slice are utilized to transfer control command and data between Memory Controller and DRAM devices. In conventional approaches, the Memory Controller allows PHY to enter into the low power mode through a Low Power Control Interface only when DRAM devices have entered into power down (PD) state or self-refresh (SREF) state.

During normal operation mode, the PHY control slice and PHY data slice are major sources of power consumption because they transfer control commands and data between Memory Controller and DRAM devices. Therefore, the conventional operation oriented method is not optimal for HBM subsystems for a few reasons.

First, in normal operation mode, the wide width of PHY data slice consumes high power during idle periods. In normal operation mode, the PHY data slices will consume much higher power than the other DDR PHY operations (e.g., reads, writes, etc.) because the HDM device has a wide DQ of 128 bits per channel, which is much more than the usual 8 bits or 16 bits of the other DDR. This results in a much bigger area of PHY data slice. In addition, the HBM subsystem typically works on a high frequency of 1 GHz. The static power may be a bottleneck even if there is no data transmission in the PHY data slice during normal operation mode.

Second, the PHY data slice consumes power during the periodic auto-refreshes in a power down state. During a HBM power down state, the Memory Controller should maintain periodic refreshes in the DRAM device. The refresh interval $t_{REFI}$ of HBM is 3900 ns while the refresh command (REF) period $t_{RFC}$ is 260 ns. The switch time between PD and REF on a power down exit (PDX) and power down enter (PDE) is approximately 15 ns. Therefore, in nearly 7.1% of PD state (e.g., (15 ns+260 ns)/3900=7.1%), the PHY data slice is operation in normal operation mode, which leads to a large amount of power consumption due to the wide data width.

As described above, the conventional operation mode oriented low power method is not ideal for HBM subsystems. Thus, it is advantageous to take advantage of any idle states to shut down the PHY data slice to reduce power consumption.

Embodiments of the invention provide an approach for using command-oriented low power control methods to accurately shut down the data slice when it is idle. FIG. 1 shows a flowchart of an approach to reduce the power consumption in different modes by shutting down the PHY data slice at suitable idle times. The operations shown in FIG. 1 may be performed at least by the Memory Controller 210, which controls the operations performed on the HBM DRAM 230, and HBM PHY 220. The process generally includes issuing a command to deactivate an open row, entering power saving mode through a low power control signal handshake, returning to normal operation mode, and accessing the open row. Such commands may be received in various different manners and various different times, and even from various different sources. However, in its simplest form, the process flow can provide access to a single set of memory devices on behalf of a single accessing element.

At 102, the Memory Controller 210 issues a command to deactivate an open row in the HBM device memory bank. In some embodiments, the Memory Controller 210 may issue a Precharge All (e.g., PREA) command or Refresh (e.g., REF) command to deactivate the open row.

At 104, the HBM subsystem enters power saving mode through a low power control handshake. Specific timing parameters define the time interval from the first command to a second command, during which time there is no data transmission between Memory Controller 210 and PHY data slice. These timing intervals may be longer than an overall low power control handshaking on the Low Power Control Interface 212. Therefore, Memory Controller 210 can utilize these idle periods to shut down the PHY data slice and enter into power saving mode. As such, the PHY data slice may enter into power saving mode through a low power control handshake.

In some embodiments, the HBM subsystem utilizes the period between the first command the second command to enter low power saving mode. As mentioned above, during the period from the first command to the next command, specific timing parameters have defined the time interval from these commands to the next command—during which time there is no data transmission between Memory Controller and the data slice of PHY. These timing intervals may be longer than an overall low power control handshaking on Low Power Control Interface ($t_{lp\_resp}$+period of dfi_lp_ctrl_req/dfi_lp_data_req both asserting+$t_{lp\_wakeup}$).

At 106, the HBM PHY returns to normal operation mode. The Memory Controller may request a PHY data slice to wake up from low power mode when delay $t_{rp}$ is about to elapse. Then, the PHY data slice will return to normal operation mode within a $t_{lp\_wakeup}$ (minimum of 16 cycles) to be ready for incoming data transmissions. The $t_{lp\_wakeup}$ specifies the clock cycles with which the PHY has to ensure that it comes out of low power mode. The low power exit does not affect the performance of data transmission because the interval from the first command to the Read or Write command is also about 16 cycles, which is equal to $t_{lp\_wakeup}$. This process will be discussed in further detail in FIG. 4.

At 108, the Memory Controller will access the open rows in the HBM device memory banks. HBM memories consist of specific power up and initialization sequences prior to their operation. Before any read or write transaction can occur, a particular row of the memory bank should be activated (which essentially activates and amplifies the signals from that row). Activating a bank refers to opening a page in a bank. Opening a page in a bank copies data from the memory core to a small internal static memory (the sense amplifiers) from which the real read or write transactions happen. After the end of the transaction, it is closed if no further access to the row is needed.

In some embodiments, the Memory Controller issues a command to open the row of the activated HBM memory bank. Before the row is accessed, a row in that bank should open via an Activate command. Once the row is open, the Memory Controller will issue a Read or Write command after a time elapses.

In some embodiments, the Memory Controller may access the memory bank for a specific timing period. During the period from the first command to the second command, there are only control commands on DFI control signals. This occurs because there are no data transmissions on DFI data signals between Memory Controller and PHY data slice during this time. Therefore, the PHY may take advantage of this time period to enter into power saving mode through a low power control handshake.

In some embodiments, a command can deactivate the open rows in all banks of HBM devices. When the command is issued the banks will be in an idle state and available for a subsequent row access for a specific time. The Memory Controller may issue a second command to open a row in that bank before any row can be accessed. Once a row is open, the Memory Controller may issue a Read or Write command to that row. This process will be discussed in further detail in FIG. 3.

Figure 2:
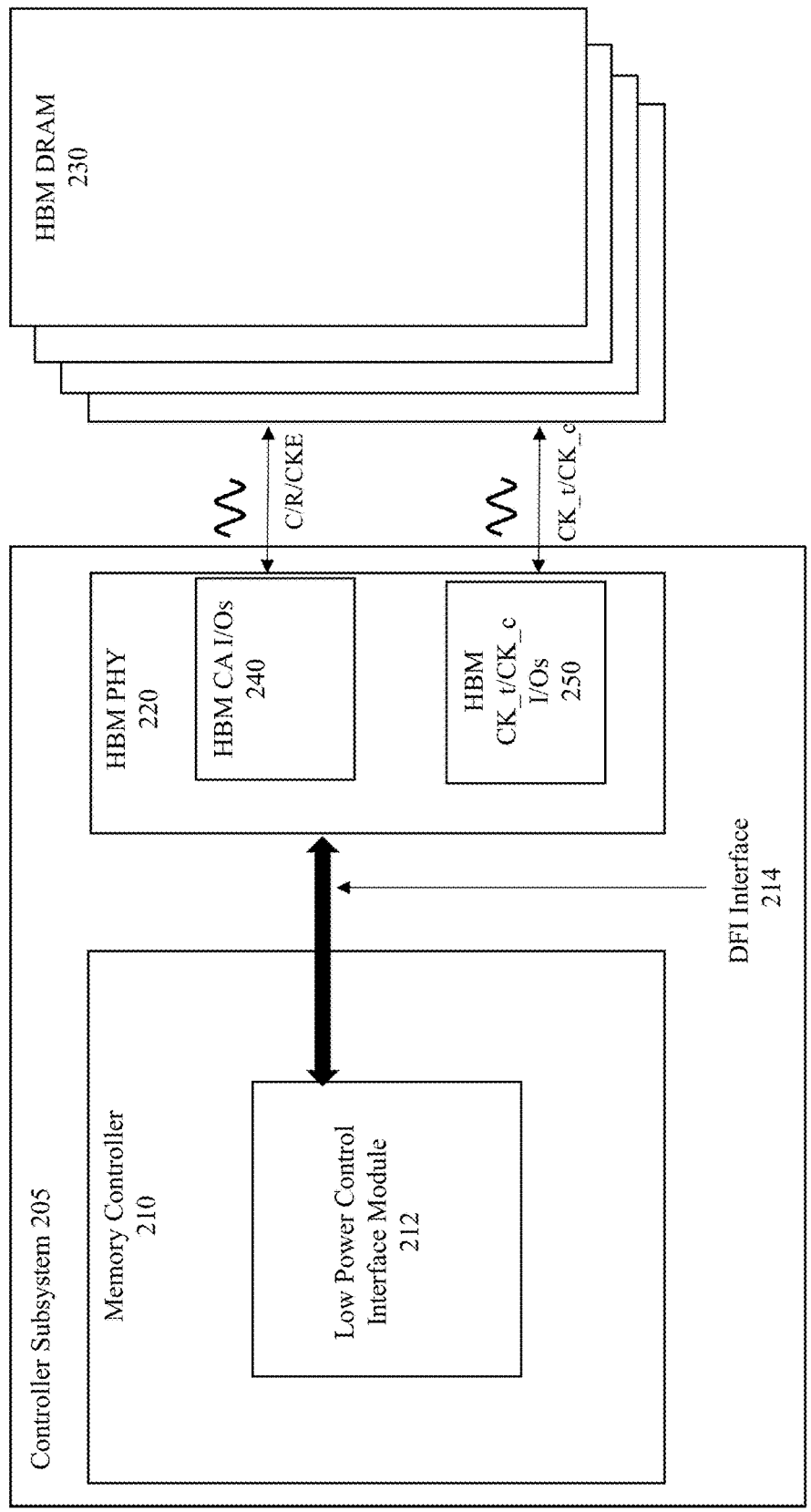
FIG. 2 illustrates a schematic diagram illustrating an example system for lowering power consumption through a low power control signal handshake according to some embodiments of the invention.

FIG. 2 is a schematic diagram illustrating a system which may be employed in some embodiments of the invention to implement a command-oriented method to lower power consumption. The controller sub-system 205 may include, for example, Memory Controller 210, and HBM PHY 220. The HBM CA I/Os 240 and CK_t/CK_C I/Os 250 enable the HBM PHY 220 to communicate with the HBM DRAM 230. The DFI interface 214 defines the DDR PHY Interface (DFI) signals, timing parameters and programmable parameters to transfer control information and data over the DFI, to and from DRAM devices, and between the Memory Controller 210 and the HBM PHY 220.

A typical Memory Controller 210 facilitates the access of a memory module in the computer system, where the memory module may include one or more memories. The Memory Controller 210 transmits a host of signals to the memory including address signals, control signals, clock signals, etc. to access data from the memory or to send data to the memory. In one embodiment, the Memory Controller 210 communicates with the HBM DRAM 230 via signals including, but not limited to, a control signal, a clock signal, command, signals, and any other signals to cause communication between the memory controller and the HBM DRAM 230.

The Memory Controller 210 also controls the low power mode transitions—thus, providing the flexibility of putting the memory modules in low power states and exiting from them. The Memory Controller 210 may include a Low Power Control Interface Module 212 that handles transmissions of signals to enter and exit an idle state. The DFI bus is in an idle state when the control interface is not sending any commands and all read and write data have transferred on the DFI bus, reached its destination, and the write data transfer has completed on the DRAM bus. Depending on the state of the system, the Memory Controller 210 communicates state information to the PHY 220 allowing the PHY 220 to enter the appropriate power saving state.

The Low Power Control Interface 212 consists of signals that inform the PHY 220 of a low power mode opportunity, as well as how quickly the Memory Controller 210 will require the PHY 220 to resume normal operation, and timing parameters. The table below describes the signals and timing parameters used in the Low Power Control Interface:

| Signal | From | Description |
| --- | --- | --- |
| dfi_lp_ack | PHY | Low power acknowledge. The dfi_lp_ack signal is asserted to acknowledge the MC low power opportunity request. The PHY is not required to acknowledge this request. |
| dfi_lp_ctrl_req | MC | Low power opportunity control request. the dfi_lp_ctrl_req signal is used by the MC to inform the PHY of an opportunity to switch to a low power mode. When asserted, the MC indicates that no more commands will be sent on the Control Interface. |
| dfi_lp_data_req | MC | Low power opportunity data request. The dfi_lp_data_req signal is used by the MC to |

-continued

| Signal | From | Description |
|---|---|---|
| | | inform the PHY of an opportunity to switch to a low power mode. When asserted, the MC indicates that no more commands will be sent on the Data Interface. |
| dfi_lp_wakeup | MC | Low power wakeup time. The dfi_lp_wakeup signal indicates which one of the 16 wakeup times the MC is requesting for the PHY. |
| $t_{lp\_resp}$ | MC | Specifies the maximum number of DFI clock cycles after the assertion of dfi_lp_ctrl_req or dfi_lp_data_req signal to the assertion of the dfi_lp_act signal. |
| $t_{lp\_wakeup}$ | MC | Specifies the target maximum number of DFI clock cycles that the dfi_lp_ack signal may remain asserted after the de-assertion of the dfi_lp_ctrl_req or dfi_lp_data_req signal. The dfi_lp_ack signal may de-assert at any cycle after the de-assertion of the dfi_lp_ctrl_req or dfi_lp_data_req signal. Exceeding the maximum is not considered an error condition. |

The HBM PHY 220 may also include the HBM CA I/Os 240 and CK_t/CK_C I/Os 250, which enable the HBM PHY 220 to communicate with the HBM DRAM 230. Note that in the following drawings of the embodiments, signals are represented with lines. Some lines may have arrows at one end to indicate the primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The DFI Interface 214 is an interface protocol that defines DFI signals, timing parameters, and programming parameters to transfer control information and data over the PHY to and from DRAM devices.

The HBM PHY 220 is a key element in the overall HBM system. The HBM PHY 220 generally receives HBM DRAM row-col commands, data, parity, etc. from the memory controller 210 through a DFI interface 214 and passes them to HBM memory along with the use of HBM DRAM interface. It deals with two different interfaces and supports multiple frequency ratios for DFI interfaces. HBM PHY 220 should support all HBM memory features like frequency ratios, data rates, memory sizes, pseudo channel modes, legacy modes, DBI, DM, etc.

The HBM DRAM 230 is a memory chip that can support low power consumption, ultra-wide communication lanes, and stacked configurations. Vendor-specific HBM memory can be used to connect with HBM JEDEC interfaces. HBM defines two physically independent CA buses: Row command and Column command (C/R) bus and a control signal (CKE). HBM DRAM 230 memory connects with HBM PHY 220 with the HBM JEDEC interfaces. HBM protocol defines a 1.6 Gbps data rate with a frequency of 800 MHz. The HBM DRAM 230 memory can receive HBM commands, data, data mask, parity, etc. from HBM PHY 220. Accordingly, each HBM devices may have vendor-specific features, functions and timings.

Figure 3:
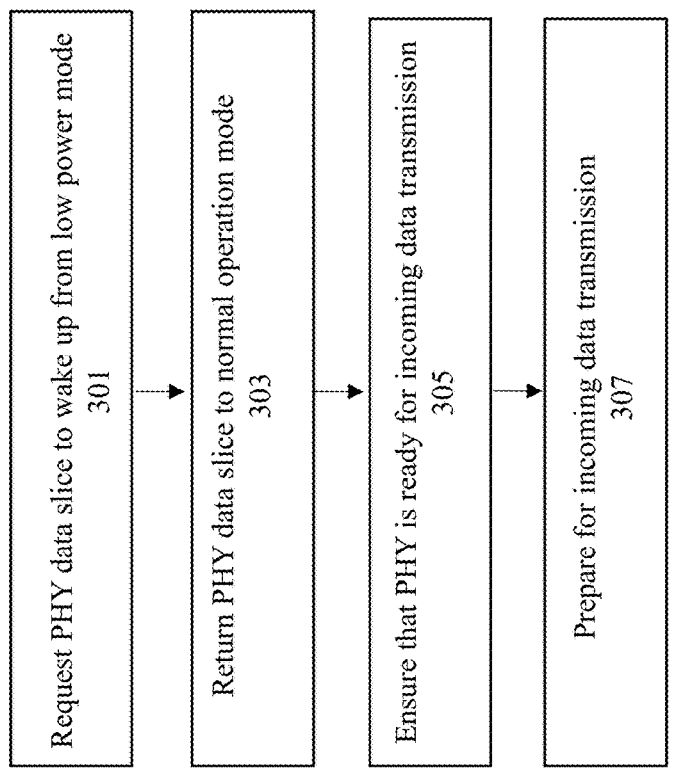
FIG. 3 illustrates an expanded view of the process to return to normal operation mode shown in FIG. 1 according to some embodiments of the invention.

FIG. 3 illustrates an expanded view of the process of returning to normal operation mode according to some embodiments of the invention.

At 301, the Memory Controller will request PHY data slice to wake up when the delay of $t_{rp}$ is about to elapse. At 303, the Memory Controller returns PHY data slice to normal operation mode. At 305, the Memory Controller de-asserts dfi_lp_ack within a specific clock cycle (minimum of 16 cycles) to ensure that PHY data slice comes out of low power to be ready for incoming data transmission. The low power control exit will not affect the performance of data transmission because the interval from the Activate command to the read and write command is also 16 cycles. At 307, the HBM DRAM is ready for incoming data transmission.

Figure 4:
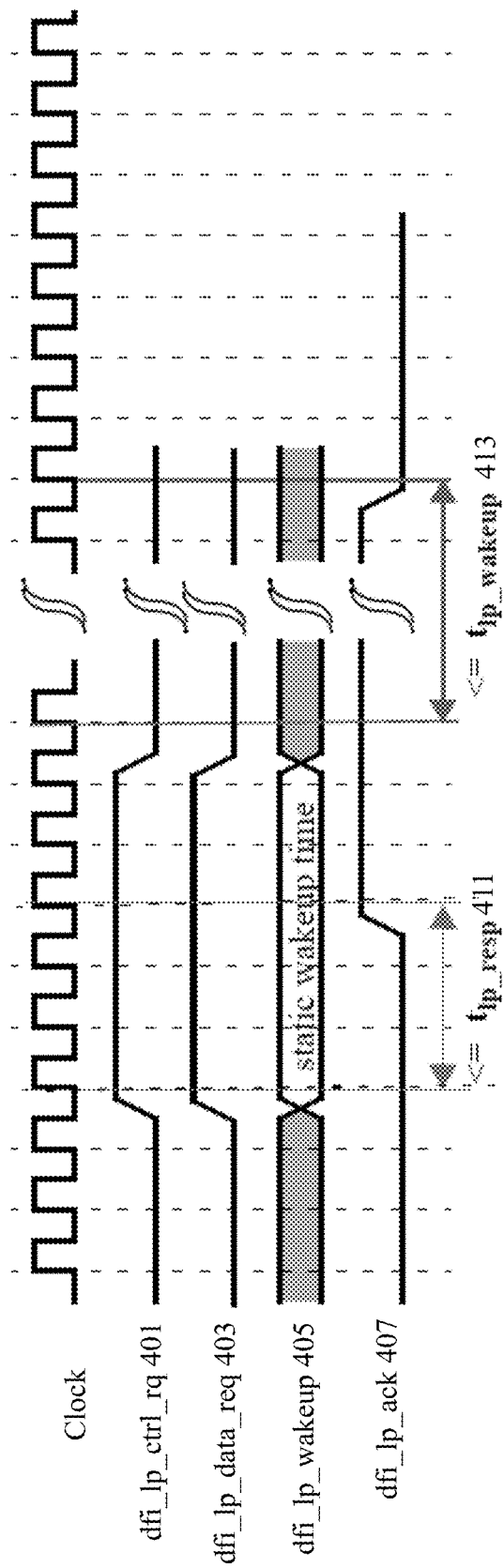
FIG. 4 illustrates a low power control handshaking timing diagram for a sequence in which the low power request is acknowledged according to some embodiments of the invention.

FIG. 4 shows a low power control handshaking timing diagram for a sequence in which the low power request is acknowledged. When the PHY has knowledge that the DFI will be idle for a period of time, the PHY will enter a Memory Controller-initiated low power state. During a low power handshake, the DFI clock should maintain a valid and constant clock operating frequency until dfi_lp_data_req 403, dfi_lp_ack 407, and dfi_lp_wakeup 405 have reached a constant state. When the Memory Controller 210 detects an idle time, the Memory Controller 210 asserts the dfi_lp_data_req 403 signal to the PHY 220 and the dfi_lp_wakeup 405 signal with the wakeup time required. The PHY 220 can acknowledge the request and go into low power mode based on the wakeup time required and remain in low power mode as long as the request and acknowledge are both asserted. If the request is acknowledged through the assertion of the dfi_lp_ack signal 407, the PHY 220 may enter a low power mode as long as the dfi_lp_ctrl_req 401 or dfi_lp_data_req 403 signal remains asserted. Once the dfi_lp_ctrl_req 401 and dfi_lp_data_req 403 signal is de-asserted, the PHY will return to normal operating mode within the number of cycles indicated by the dfi_lp_wakeup signal 405.

The low power acknowledge (e.g., dfi_lp_ack 407) does not need to be asserted when the low power opportunity control request (e.g., dfi_lp_ctr_req 401) or low power opportunity data request (e.g., dfi_lp_data_req 403) signal is asserted. The Memory Controller 210 should assert low power opportunity control request (e.g., dfi_lp_ctr_req 401) or low power opportunity data request (e.g., dfi_lp_data_req 403) signal for at least $t_{lp\_resp}$ 411 cycles. If the low power acknowledge (e.g., dfi_lp_ack 407) is not asserted within the $t_{lp\_resp}$ 411 cycles, the PHY 220 will not assert acknowledge for the current request the low power opportunity control request (e.g., dfi_lp_ctr_req 401) or low power opportunity data request (e.g., dfi_lp_data_req 403) signal should be de-asserted after $t_{lp\_resp}$ 411 cycles have elapsed without an acknowledge.

The Memory Controller 210 uses a low power opportunity control request (e.g., dfi_lp_ctr_req 401) and low power opportunity data request (e.g., dfi_lp_data_req 403) to send low power requests individually to the control slice and data slice of PHY. The low power wake up time information is indicated by a low power wakeup time (e.g., dfi_lp_wakeup 405). Wakeup time is a specific number of cycles ($t_{lp\_wakeup}$ cycles) in which the PHY 220 is expected to respond to a signal change on the DFI. The DFI specification specifies up to 16 different wakeup times. Generally, the PHY 220 should enter the lowest supported power state that allows low power exit within the required wake up time. The wakeup time may be an average or estimated delay; therefore, exceeding the wakeup time should not be treated as an error condition.

The Memory Controller 210 ensures that dfi_lp_ctrl_req 401 or dfi_lp_data_req 403 will be asserted and the dfi_lp_wakeup 405 signal will be constant for at least $t_{lp\_resp}$ 411 cycles, allowing the PHY 220 time to respond. To acknowledge the request, the PHY 220 will assert dfi_lp_ack_signal 409 within $t_{lp\_resp}$ clock cycles 411 of the request signal assertion, during which time the Memory Controller 210 will hold the dfi_lp_wakeup 405 signal constant. Once the request is acknowledged by the PHY 220, the Memory Controller 210 may de-assert the dfi_lp_ctr_req 401 or dfi_lp_data_req 403 signal. The PHY 220 is expected to de-assert the dfi_lp_ack 407 signal within $t_{lp\_wakeup}$ clock cycles 413 after the dfi_lp_ctrl_req 401 or dfi_lp_data_req 403 signal is de-asserted and be ready for normal operation.

PHY 220 may enter a low power mode as long as the low power opportunity control request (e.g., dfi_lp_ctr_req 401) and low power opportunity data request (e.g., dfi_lp_data_req 403) remains asserted. The PHY 220 acknowledges low power acknowledge (e.g., dfi_lp_ack 407) after shutting down both control slice and data slice within $t_{lp\_resp}$ 411 cycles. Once the low power opportunity control request (e.g., dfi_lp_ctr_req 401) or low power opportunity data request (e.g., dfi_lp_data_req 403) signal is de-asserted, the PHY 220 will return to normal operation mode within the number of cycles indicated by the dfi_lp_wakeup signal 405.

Figure 5A:
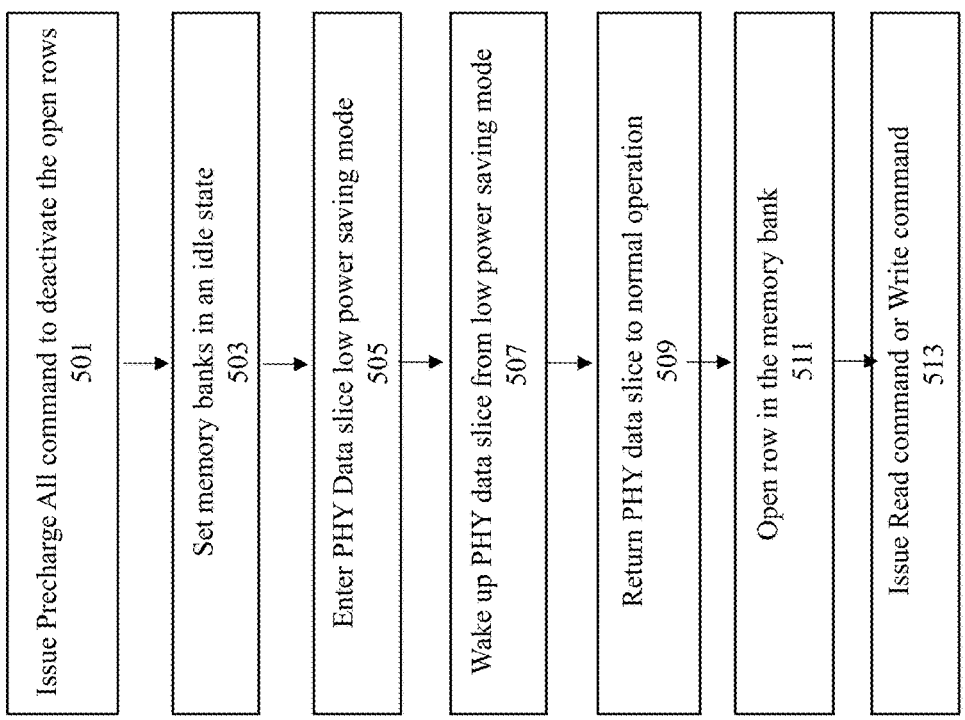
FIG. 5A illustrates a process flow for a command-oriented approach using a Precharge All command to lower power consumption by using according to some embodiments of the invention.
Figure 5B:
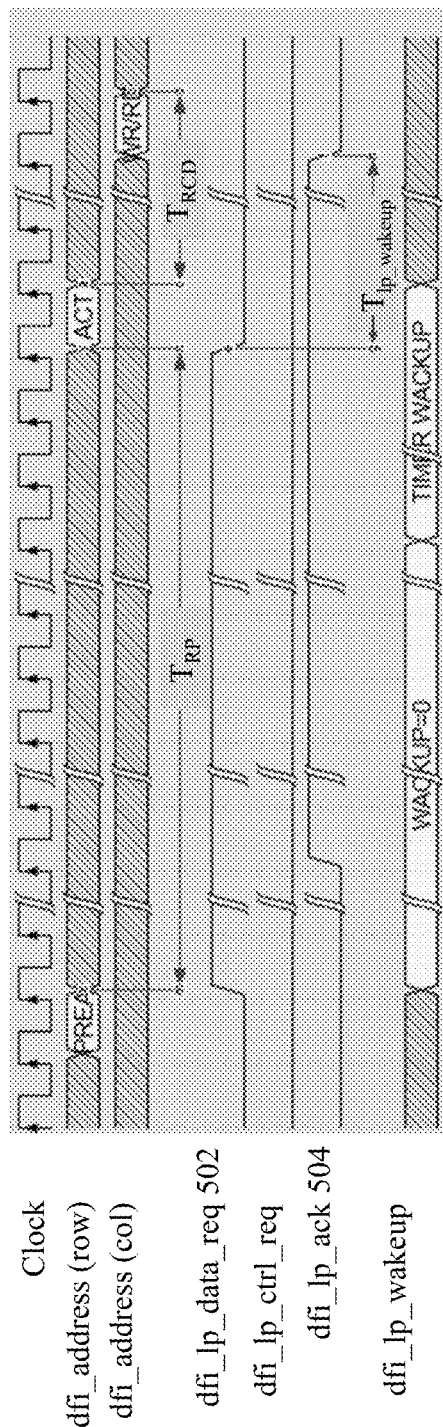
FIG. 5B illustrates a timing diagram for a command-oriented approach using a Precharge All command to lower power consumption according to some embodiments of the invention.

FIG. 5A shows a process flow for using a command-oriented approach to issue a Precharge All command to lower power consumption according to some embodiments of the invention while FIG. 5B shows a timing diagram of the process.

At 501, the Memory Controller issues a Pre-Charge All (e.g., PREA) command to deactivate the open rows in all banks of HBM devices. At 503, the banks are set in an idle state for subsequent row access for a specific time ($T_{RP}$) after the PREA command is issued.

At 505, PHY data slice will enter power saving mode through a low power control handshake between low power opportunity data request (e.g., dfi_lp_data_req 502) and low power acknowledge (e.g., dfi_lp_ack 504). When the delay of $t_{rp}$ is about to elapse, the Memory Controller will de-assert the low power opportunity data request (e.g., dfi_lp_data_req 502) to request the PHY data slice to wake up from low power mode at 507.

At 509, the PHY data slice will return to normal operation mode and de-assert low power acknowledge (e.g., dfi_lp_ack 504) within the t wakeup (minimum of 16 cycles) to be ready for incoming data transmissions. The low power exit of PHY data slice will not inhibit the incoming data transmission because the interval from an Activate command to Read or Write command is also about 16 cycles.

At 511, issuing an Activate command (e.g., ACT) will open a row in the memory bank. At 513, once a row is open, the Memory Controller may issue a Read or Write command to that row after the time $t_{RCD}$ elapses. During this period from the Precharge All command to the Read or Write command, there are only control commands on DFI control signals because there are no data transmissions on the DFI signals between Memory Controller and PHY data slice as shown in 708.

Figure 6A:
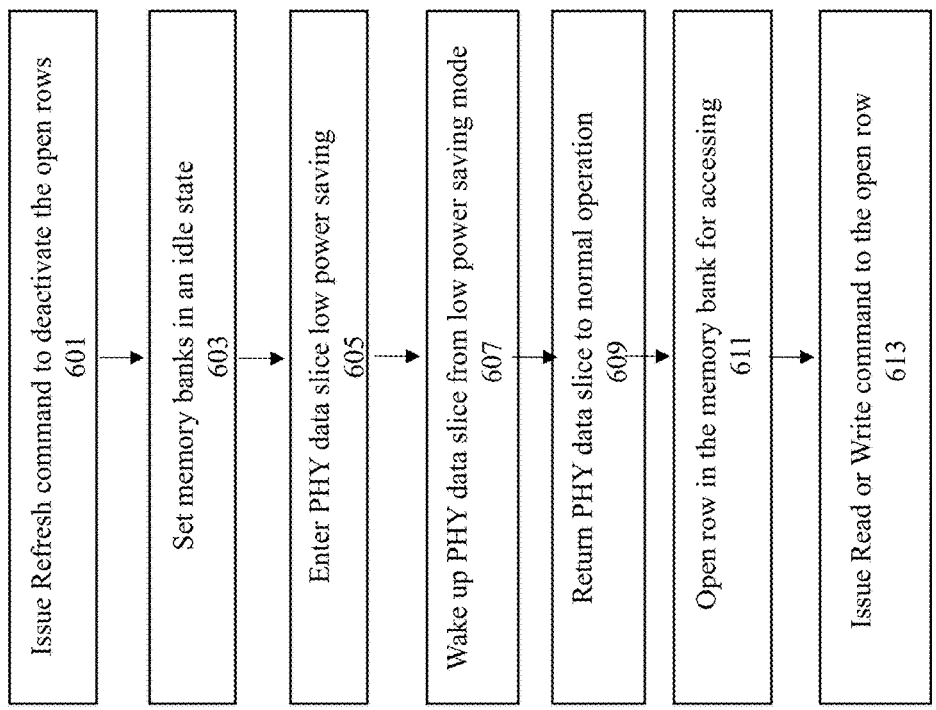
FIG. 6A illustrates a process flow for using a command-oriented approach in using a Refresh command to lower power consumption according to some embodiments of the invention.
Figure 6B:
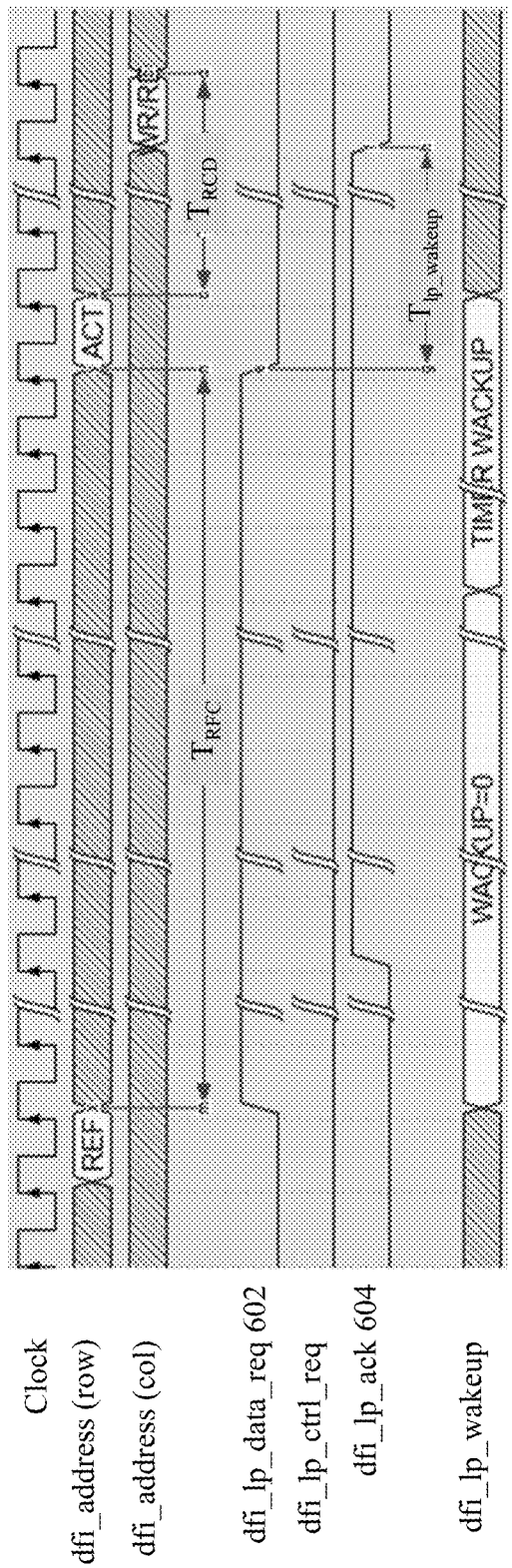
FIG. 6B illustrates a timing diagram for a command-oriented approach using a Refresh command to lower power consumption according to some embodiments of the invention.

FIG. 6A illustrates a process flow for using a Refresh command to lower power consumption by using a command-oriented method according to some embodiments of the invention and FIG. 6B illustrates a timing diagram of the process.

At 601, the Memory Controller issues a refresh command to deactivate the open rows in the memory banks. At 603, the banks are set in an idle state for subsequent row access for a specific time ($t_{RFC}$) after the refresh command is issued. At 605, PHY data slice may enter power saving mode through a low power control handshake between low power opportunity data request (e.g., dfi_lp_data_req 602) and low power acknowledge (e.g., dfi_lp_ack 604). During the period from Refresh command to the Read or Write command, there is no data transmission between Memory Controller and PHY data slice for a time period (e.g., $t_{RFC}$ + $t_{RCD}$). The Memory Controller may utilize this window to request PHY data slice to enter low power mode.

At 607, when the delay of $t_{rp}$ is about to elapse, the Memory Controller will de-assert low power opportunity data request (e.g., dfi_lp_data_req 602) to request the PHY data slice to wake up from low power mode. At 609, the PHY data slice will return to normal operation mode and de-assert low power acknowledge (e.g., dfi_lp_ack 604) within the $t_{lp\_wakeup}$ (minimum of 16 cycles) to be ready for incoming data transmissions. The low power exit of PHY data slice will not inhibit the incoming data transmission because $t_{lp\_wakeup}$ and $t_{RCD}$ are both 16 cycles.

At 611, the Memory Controller may open a row in that bank via an Activate command (e.g., ACT). Once a row is open, the Memory Controller will issue a Read or Write command that row after the time $T_{RCD}$ elapses at 613.

Figure 7A:
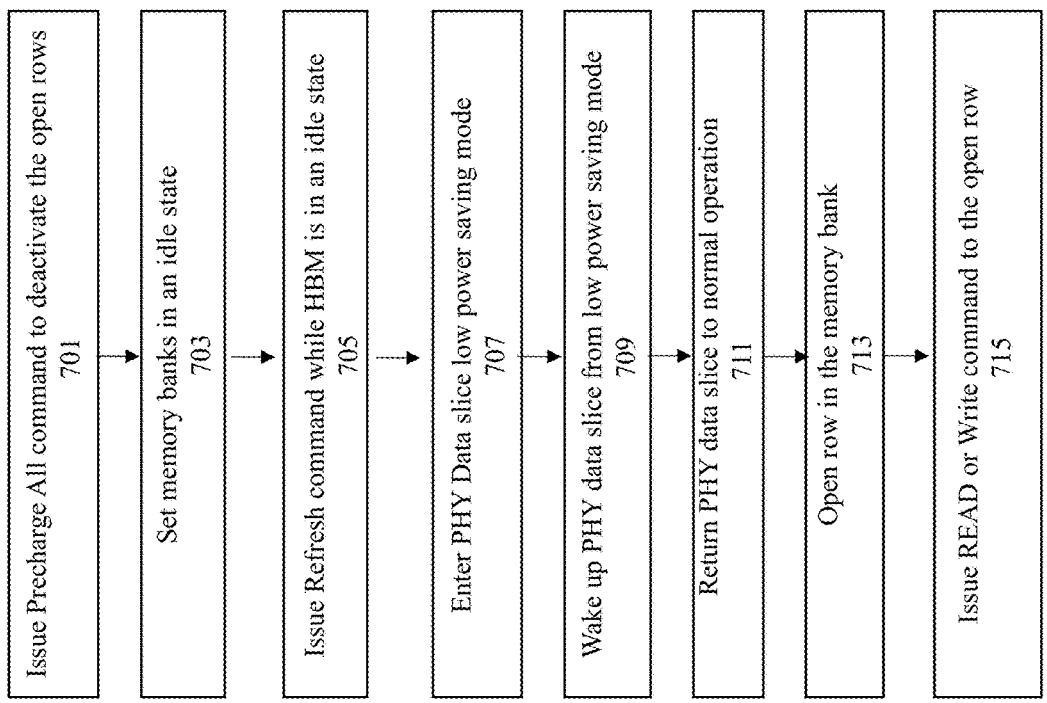
FIG. 7A illustrates a process flow for a command-oriented method using Precharge All and Refresh commands to lower power consumption according to some embodiments of the invention.
Figure 7B:
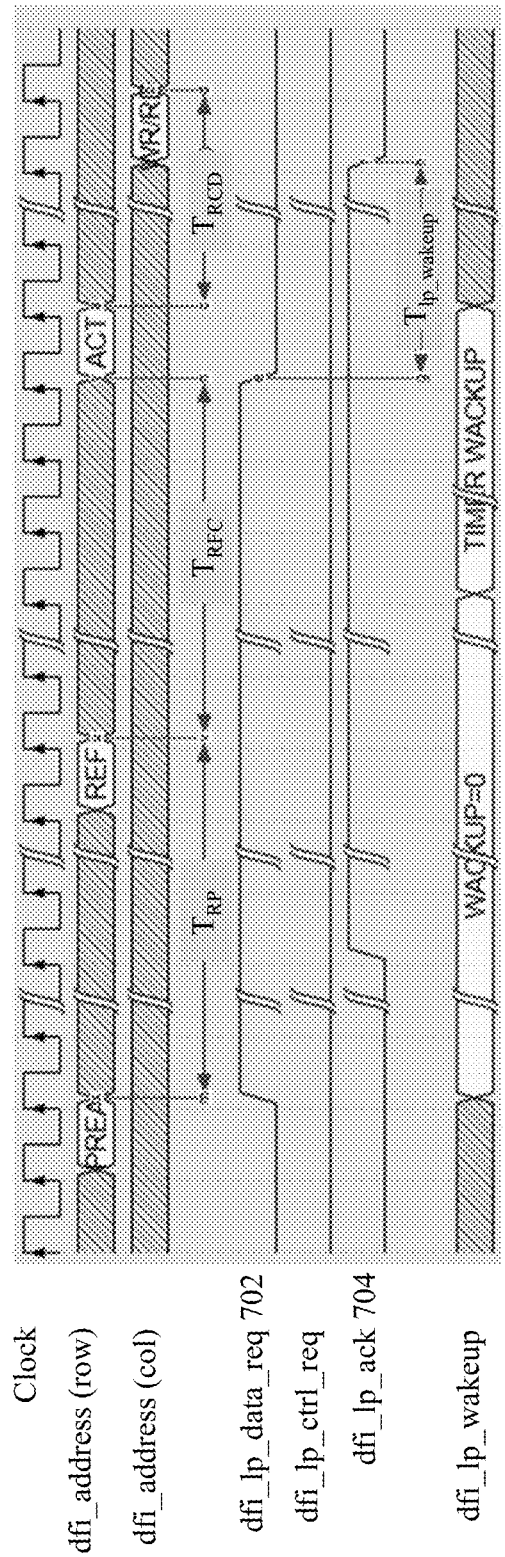
FIG. 7B illustrates a timing diagram for using a command-oriented approach using Precharge All and Refresh commands to lower power consumption according to some embodiments of the invention.

FIG. 7A illustrates a process flow for using a command-oriented method through using Precharge All and Refresh commands to lower power consumption according to some embodiments of the invention and FIG. 7B illustrates a timing diagram of the process.

At 701, the Memory Controller issues a Pre-Charge All (e.g., PREA) command to deactivate the open rows in all banks of HBM devices. At 703, the memory banks are set in an idle state for subsequent row access for a specific time ($t_{rp}$) after the PREA command is issued. At 705, the Memory Controller issues a Refresh command while the HBM is still in an idle state. The idle start starts from the delay $t_{RP}$ after the Pre-Charge All command is issued.

At 707, PHY data slice enters into power saving mode through a low power control handshake between low power opportunity data request (e.g., dfi_lp_data_req 702) and low power acknowledge (e.g., dfi_lp_ack 704). When the delay of $t_{RFC}$ is about to elapse, the Memory Controller will de-assert low power opportunity data request (e.g., dfi_lp_data_req 702) to request the PHY data slice to wake up from low power mode before the delay ($t_{RPC}$) is about to elapse at 709.

At 711, the PHY data slice will return to normal operation mode and de-assert low power acknowledge (e.g., dfi_lp_ack 704) within the $t_{lp\_wakeup}$ (minimum of 16 cycles) to be ready for incoming data transmissions. The low power exit of PHY data slice will not inhibit the incoming data transmission because the interval from the Activate command to Read or Write command is also about 16 cycles.

At 713, the Memory Controller opens a row in the memory bank via an Activate command (e.g., ACT). Once a row is open, the Memory Controller issues a Read or Write command that row after the time $t_{RCD}$ elapses at 715. During this period from the Precharge All command to Refresh command and from REF to Activate, there are only control commands on DFI control signals because there are no data transmissions on the DFI signals between Memory Controller and PHY data slice.

Figure 8A:
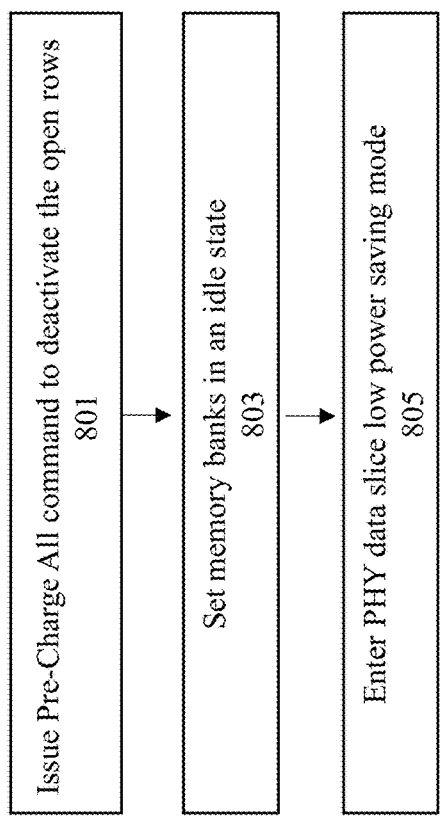
FIG. 8A illustrates a process flow for using a command-oriented approach using Precharge All and Self Refresh commands to lower power consumption according to some embodiments of the invention.
Figure 8B:
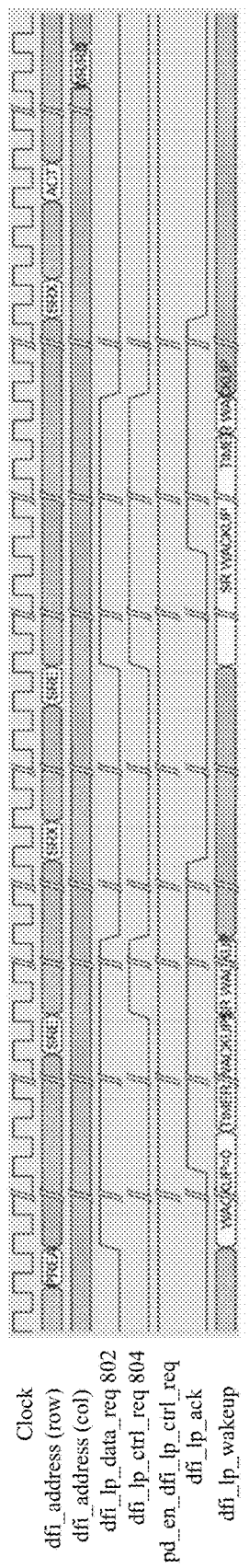
FIG. 8B illustrates a timing diagram for using a command-oriented approach using Precharge All and Self Refresh commands to lower power consumption according to some embodiments of the invention.

FIG. 8A illustrates a process flow for using command-oriented methods by using Precharge All and Self Refresh commands to lower power consumption according to some embodiments of the invention and FIG. 8B illustrates a timing diagram of the process.

As described above, during a self-refresh enter (SRE) command, the Memory Controller will request both PHY control and PHY data slice to enter into low power mode through the Low Power Control Interface. In self-refresh mode, the memory retains data without external clocking while the rest of the system may be powered down. The period from Pre-charge All to PDE/SRE can place PHY data slice into power saving mode in advance. This is advantageous because the memory would consume much lower power than asserting low power opportunity data request (e.g., dfi_lp_data_req 802) and low power opportunity control request (e.g., dfi_lp_ctrl_req 804) together after SRE to request a low power mode.

Figure 9A:
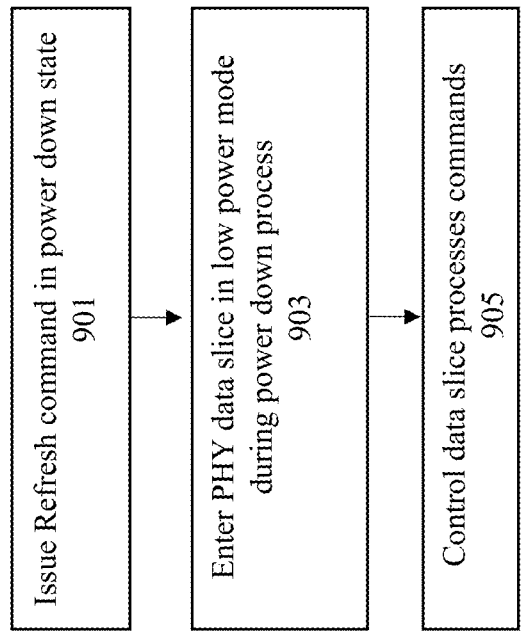
FIG. 9A illustrates a process flow for using a command-oriented approach to reduce the power consumption during a Refresh command in a power down state according to some embodiments of the invention.
Figure 9B:
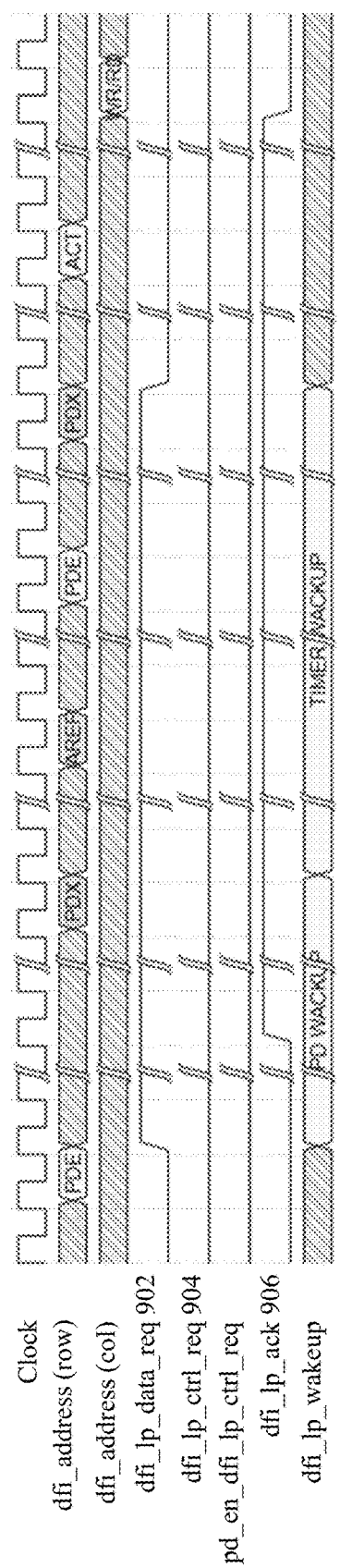
FIG. 9B illustrates a timing diagram for using a command-oriented approach to reduce the power consumption of PHY during a Refresh command in a power down state according to some embodiments of the invention.

At 801, the Memory Controller will issue a Pre-Charge All (e.g., PREA) command to deactivate the open rows in all memory banks of HBM. At 803, the banks will be set in an idle state for subsequent row access for a specific time ($t_{rp}$) after the PREA command is issued. Here, the period from PREA to PDE/SRE can be utilized to put PHY data slice into power saving mode in advance. At 805, PHY data slice may enter into low power saving mode FIG. 9A illustrates a process flow using a command-oriented method to reduce PHY power consumption during a Refresh command in a power down state according to some embodiments of the invention and FIG. 9B illustrates a timing diagram of the process. Memory Controller and PHY will use a low power control handshake to keep the PHY data slice in low power mode throughout the entire process.

At 901, the Memory Controller issues a Refresh command during a power down state. At 903, the PHY data slice enters low power mode through a low power control handshake between the low power opportunity data request (e.g., dfi_lp_data_req 902) and low power opportunity control request (e.g., dfi_lp_ack 906) during the power down process. At 905, the control slice (e.g., dfi_lp_ctrl_req 904) processes the PDE, PDX, and REF commands.

SYSTEM ARCHITECTURE OVERVIEW

Figure 10:
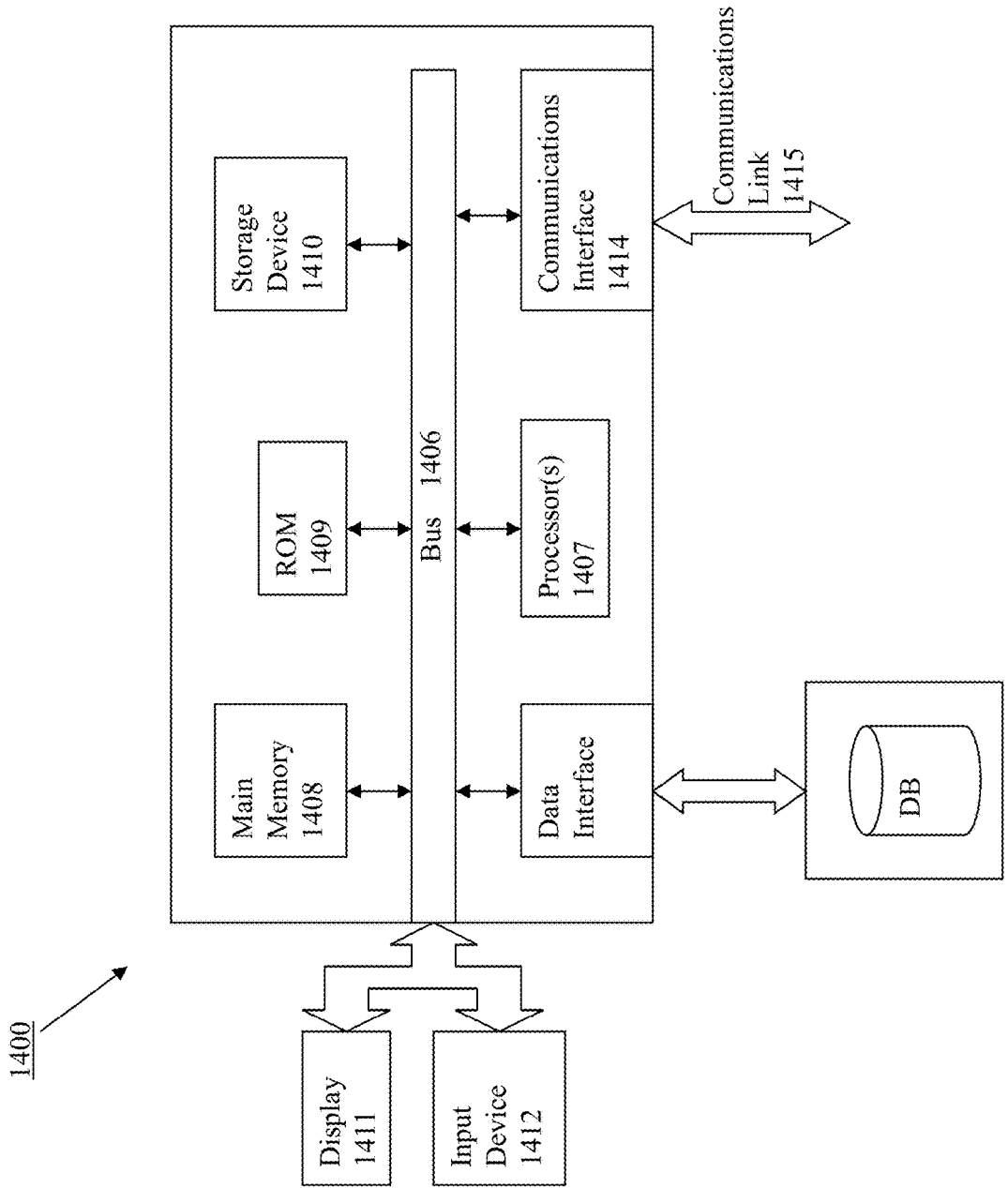
FIG. 10 depicts a block diagram of an instance of a computer system suitable for implementing an embodiment of the present disclosure.

FIG. 10 is a block diagram of an illustrative computing system suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method for using a command-oriented power technique to lower the power consumption of mixed-signal physical interface (PHY), comprising:
    issuing a first command to deactivate an open row in a memory bank;
    entering a power saving mode through a signal handshake during an idle period, wherein the idle period comprises a period of time when there is no data transmission between a memory controller and at least one PHY data slice;
    determining a first number of clock cycles for an exit command that is executed to exit the power saving mode, wherein the first number of clock cycles for the exit command is determined based at least in part upon a second number of clock cycles between an activate command and a second command;
    returning to a normal operation mode using at least the exit command; and
    accessing the open row in the memory back at least by issuing the second command.

2. The method of claim 1, wherein returning to the normal operation mode comprises de-asserting a DDR PHY Interface (DFI) signal.

3. The method of claim 1, wherein issuing the first command comprises issuing at least a Precharge All command or a Refresh command, and the activate command is executed to activate the open row, and the second command is executed to perform input and/or output (I/O) operations on the open row.

4. The method of claim 1, wherein entering power saving mode comprises a handshake between two DFI (DDR PHY Interface) signals.

5. The method of claim 1, wherein the idle period comprises a time period between issuing the first command and issuing the second command.

6. The method of claim 1, further comprising:
requesting the at least one PHY data slice to wake up from the power saving mode; and
return the at least one PHY data slice to the normal operation mode within the first number of clock cycles.

7. The method of claim 6, wherein the first number of clock cycles comprises 16 cycles.

8. The method of claim 1, wherein the memory bank comprises a high bandwidth memory (HBM) that is defined by JEDEC (Joint Electron Device Engineering Council).

9. The method of claim 1, further comprising issuing a Refresh command after issuing the first command to deactivate the open row in the memory bank, wherein the Refresh command is issued while the open row is in an idle state.

10. The method of claim 1, wherein the idle period comprises a time period during a power down state.

11. A system for using a command-oriented power technique to lower the power consumption of mixed-signal physical interface (PHY), comprising:
a memory bank;
a memory controller that provides instructions to control operations of the memory bank; and
a PHY interface coupled to the memory bank, the PHY interface providing a physical connection between the memory bank and a memory controller, wherein
in response to a first command issued by the memory controller, the PHY interface receives a DDR PHY (DFI) handshake from the memory controller to shut down at least one PHY data slice during an idle period at least by deactivating an open row in the memory bank to enter a power saving mode,
in response an exit command that is issued by the memory controller and is determined based at least in part upon a first number of clock cycles for the exit command and a second number of clock cycles between an activate command and a second command, the PHY interface returns the at least one PHY data slice from the power saving mode to a normal operating mode, and
the PHY interface receives from the memory controller the second command that, when executed, performs input and/or output operations on the open row in the memory bank.

12. The system of claim 11, wherein returning the at least one PHY data slice to the normal operation mode comprises de-asserting a DFI (DDR PHY Interface) signal.

13. The system of claim 11, wherein the memory controller providing the instructions to control the operations of the memory bank is configured to issue the first command to deactivate the open row in the memory bank and to issue the second command to access the open row in the memory bank.

14. The system of claim 13, wherein the first command comprises at least a Precharge All command or a Refresh command.

15. The system of claim 11, wherein entering the power saving mode comprises a handshake between two DFI (DDR PHY Interface) signals.

16. The system of claim 13, wherein providing instructions to control operations of the memory bank comprise instructions to request the at least one PHY data slice to wake up from the power saving mode and to return the at least one PHY data slice to the normal operation mode within the first number of clock cycles.

17. The system of claim 11, comprising at least one of low power control interface module and inputs/outputs (I/Os) on the memory bank.

18. The system of claim 11, wherein the memory bank comprises a high bandwidth memory (HBM) that is defined by JEDEC (Joint Electron Device Engineering Council).

19. The system of claim 13, wherein the memory controller providing the instructions to control the operations of the memory bank is configured to process instructions to issue a Refresh command after issuing the first command to deactivate the open row in the memory bank, the Refresh command being issued while the open row is in an idle state.

20. The system of claim 11, wherein the idle period comprises the time period during a power down state.

* * * * *